United States Patent [19]

Melas

[11] Patent Number: 5,147,688
[45] Date of Patent: Sep. 15, 1992

[54] MOCVD OF INDIUM OXIDE AND INDIUM/TIN OXIDE FILMS ON SUBSTRATES

[75] Inventor: Andreas A. Melas, Burlington, Mass.

[73] Assignee: CVD, Inc., Woburn, Mass.

[21] Appl. No.: 639,374

[22] Filed: Jan. 11, 1991

Related U.S. Application Data

[62] Division of Ser. No. 514,055, Apr. 24, 1990, abandoned.

[51] Int. Cl.$^5$ .................. C23C 16/18; C23C 16/40
[52] U.S. Cl. .................. 427/255.3; 427/255.2; 427/255.1; 427/248.1; 427/314; 427/126.3; 427/109; 427/166
[58] Field of Search ............... 427/255.3, 255.2, 255.1, 427/248.1, 109, 126.3, 314, 166, 165; 428/432; 65/60.52

[56] References Cited

U.S. PATENT DOCUMENTS

| | | | |
|---|---|---|---|
| 3,854,992 | 12/1974 | Kane | 427/255 |
| 3,944,684 | 3/1976 | Kane et al. | 427/109 |
| 3,949,146 | 4/1976 | Kane | 428/432 |
| 3,949,259 | 4/1976 | Kostlin et al. | 428/432 |
| 4,006,070 | 2/1977 | King et al. | 428/432 |
| 4,325,988 | 4/1982 | Wagner | 427/160 |
| 4,345,000 | 8/1982 | Kawazoe et al. | 428/701 |
| 4,419,386 | 12/1983 | Gordon | 427/109 |
| 4,568,578 | 2/1986 | Arfsten et al. | 428/34 |
| 4,647,548 | 3/1987 | Klein | 501/134 |
| 4,720,560 | 1/1988 | Hui et al. | 556/1 |
| 4,859,499 | 8/1989 | Sauvinet et al. | 427/108 |

FOREIGN PATENT DOCUMENTS 2116590B 5/1985 United Kingdom .

Primary Examiner—Michael Lusignan
Assistant Examiner—Roy V. King
Attorney, Agent, or Firm—Wayne E. Nacker; Gerald K. White

[57] ABSTRACT

Disclosed is a metalorganic chemical vapor deposition (MOCVD) process of depositing an indium oxide or an indium/tin oxide film on a substrate using indium alkyl etherate or indium alkyl etherate and organotin compound precursors, respectively.

14 Claims, No Drawings

MOCVD OF INDIUM OXIDE AND INDIUM/TIN OXIDE FILMS ON SUBSTRATES

This is a divisional of co-pending application Ser. No. 07/514,055 filed on Apr. 24, 1990, now abandoned.

BACKGROUND OF THE INVENTION

1. Technical Field

The invention is directed to a method of depositing an oxide coating containing indium on a substrate, more particulary to a process of depositing an oxide coating containing indium and tin on a substrate. The invention is also directed to substrates coated by the method of the invention.

2. Brief Description of Background Art

Transparent, electrically conductive, tin oxide coatings are utilized, for example, in articles such as flat panel picture tubes for television screens, CRT screens or monitors for computers, faceplates for cathode ray tubes, etc. As discussed in "ITO Films: Adaptable To Many Applications" by Dennis R. Nichols, *PHOTON-ICS SPECTRA*, May, 1982, it has been reported that films of indium oxide doped with tin oxide, i.e., "ITO" films, produced using vacuum sputtering techniques can provide advantageous optical and electrical properties for such articles. However, while such films produced utilizing vacuum sputtering processes have good electrical conductivity and are transparent to visible light, vacuum sputtering processes are very costly.

It would be desirable to be able to utilize chemical vapor deposition techniques for the deposition of such films. Chemical vapor deposition techniques in general tend to be more adaptable for coating relatively large areas of substrate relatively inexpensively. However, there are a number of disadvantages associated with chemical vapor deposition systems for providing substrates having oxide films containing indium.

For example, U.S. Pat. No. 3,944,684 relates to a process for fabricating transparent, electrically conductive coatings of tin and indium oxides by chemical vapor deposition The "indium chelate" disclosed for use in the process to which the patent is directed is a solid having a relatively high melting point of 173 degrees Celsius and, moreover, is volatilized and transported in an inert gas stream at high temperatures above about 180 degrees Celsius.

Typical apparatus presently in use for chemical vapor deposition systems comprise a bubbler which contains a supply of an organometallic compound chosen for a particular process, a reactor or deposition chamber which contains the substrate on which a film is to be deposited, a source of a carrier gas which is inert to the organometallic compound in the bubbler and either inert or reactive to the compound in the deposition chamber, and optionally sources of other reactants or dopants supplied to the reaction chamber The bubbler and contents are maintained at a constant and relatively low temperature which typically is above the melting point of the organometallic compound but well below its decomposition temperature.

While it is possible to vaporize a sublimable solid organometallic compound in a bubbler, it is difficult to control its rate of vaporization. The surface area of a solid exposed to the carrier gas changes as vaporization proceeds. In contrast, a liquid contained in a bubbler with substantially vertical walls presents the same surface area of a solid to the carrier gas so long as the flow and bubble size of the carrier gas remains steady. Thus organometallic compounds for metal organic chemical vapor deposition desirably are liquids at the bubbler temperature and should have a relatively high vapor pressure, i.e., a vapor pressure of at least 1.0 torr at the bubbler temperature Moreover, the decomposition temperature of such organometallic compounds desirably should substantially exceed the bubbler temperature, but the compounds should react readily (by decomposition or otherwise) at the temperature encountered in the deposition chamber.

U.S. Pat. No. 4,720,560 is directed to organometallic compounds of gallium and indium corresponding to a specified formul $MR_x$ (M being gallium or indium) in which at least two different R substituents are associated with each metal atom. It is disclosed that the ultimate utility for such compounds, employed in metal organic chemical vapor deposition, is to provide a coating of the constituent metal, or (in combination with other reactants introduced in the deposition chamber) to provide coatings of metal oxides, nitrides, III-V compounds, and so forth. At least in part, the patent is directed to providing indium compounds, for example indium compounds having different alkyl substituents on the metal M, which indium compounds desirably are liquids at or slightly above room temperature and have a vapor pressure of at least about 1.0 torr at the bubbler temperature. After discussing the relative melting points, vapor pressures at 30 degrees Celsius and decomposition temperatures of triethylindium and trimethylindium, patentees observe that because of the lack of homology in these indium compounds and the small number of known indium compounds, that those of ordinary skill in the art have been prevented from selecting an optimal compound for indium metal organic chemical vapor deposition.

U.S. Pat. No. 4,847,399 is directed to the preparation or purification of volatile organometallic compounds corresponding to a specified formula, a specific example of which includes trimethylindium, which organometallic compounds will have less total volatile organometallic impurities than before. Under the discussion of background art, U.S. Pat. No. 4,847,399 teaches that volatile impurities are carried into the deposition chamber and thus must be minimized in chemical vapor deposition source compounds. It is further taught therein, that because many interfering solvents and organometallic compounds are volatile, and thus are difficult to separate from volatile Group III-A alkyl compounds by distillation, the problem of purity is aggravated. By way of illustration, the patent refers to the specific example of organic contamination of a Group III-A alkyl compound by the presence of complexed ether in trialkylindium compounds which are prepared in an ether solvent. Thus U.S Pat. No. 4,847,399 suggests that such complexed ethers should be avoided in organometallic chemical vapor deposition.

SUMMARY OF THE INVENTION

The present invention in part is directed to a process of depositing an oxide coating containing indium, typically containing indium and tin, on a substrate, which coating has desirable optical and electrical properties. The process comprises the steps of: (A) transporting, in an inert carrier gas, vapors of an indium compound having a melting point of less than 100 degrees Celsius and a vapor pressure of at least 1 torr at a temperature in the range of from minus 20 degrees to 100 degrees Celsius; (B) heating the substrate to a temperature of from about 200 to 800 degrees Celsius; and (C) contacting the heated substrate in an oxidizing atmosphere with vapors from the indium compound to form on the substrate the oxide coating containing indium.

In one aspect of the invention, it has been discovered that not only can an indium alkyl etherate be employed in the process of the present invention to provide oxide films having good optical and electrical properties, but utilization of such an etherate is desirable and preferred for the process.

The present invention in part also is directed to a process of depositing an oxide coating containing both indium and tin on a substrate, which coating has desirable optical and electrical properties The process comprises the steps of: (A) transporting, in an inert carrier gas, vapors of an indium compound having a melting point of less than 100 degrees Celsius and a vapor pressure of at least 1 torr at a temperature in the range of from minus 20 degrees to 100 degrees Celsius, preferably at or slightly above its melting point; (B) transporting in an inert carrier gas vapors of an organotin compound having at least one oxygen atom in a molecule thereof, having a vapor pressure of at least 1 torr at a temperature in the range of from minus 20 degrees to 100 degrees Celsius, and having a thermal stability such that the mole percent decomposition of the organotin compound at a given temperature is in a range of from 10 percent to 100 percent of the mole percent decomposition of the indium compound at the same temperature; (C) heating the substrate to a temperature of from about 200 to 800 degrees Celsius; and (D) contacting the heated substrate in an oxidizing atmosphere with vapors from the indium compound and the organotin compound to form on the substrate the oxide coating containing both indium and tin. Typically and preferably, an indium alkyl etherate is utilized as the indium compound.

Additionally, the present invention provides for a substrate having on a surface thereof an adherent, visibly transparent, electrically conductive, oxide coating produced by a method of the invention.

DETAILED DESCRIPTION OF THE INVENTION

Typical apparatus for use in the process of the invention comprises a bubbler which contains a supply of the indium compound, a reactor or deposition chamber which contains the substrate on which the oxide coating (film) is to be deposited, a source of a carrier gas which is inert to the indium compound in the bubbler and either inert or reactive to the compound in the deposition chamber, and optionally sources of other reactants or dopants supplied to the reaction chamber.

In a typical and preferred embodiment, an additional bubbler is utilized which contains a supply of an organotin compound having at least one oxygen atom in a molecule thereof. The organotin compound is further characterized by having a vapor pressure of at least 1 torr at a temperature in the range of from minus 20 degrees to 100 degrees Celsius. The thermal stability of an organotin compound for a method of the invention is similar to that of the indium compound; that is, the thermal stability of the organotin compound is such that the mole percent decomposition of the organotin compound at a given temperature is in a range of from 10 percent to 100 percent of the mole percent decomposition of the indium compound at the same decomposition temperature. Additionally, in preferred embodiments, the melting point and vapor pressure of the organotin compound is similar to that of the indium compound Each of the bubblers with contents is maintained, for example via a thermostat, at a constant and relatively low temperature which typically is above the melting point of the respective organometallic compound but well below its decomposition temperature. The contents of the bubbler containing the indium compound generally will be maintained at from $-20$ degrees Celsius to 100 degrees Celsius, preferably from 0 degrees Celsius to 80 degrees Celsius. The contents of the bubbler containing the organotin compound generally will be maintained at from $-20$ degrees Celsius to 100 degrees Celsius, preferably from $-20$ degrees Celsius to 80 degrees Celsius for the organotin compound.

Indium compounds as well as organotin compounds for a process of the invention will have a vapor pressure of at least 1.0 torr at the temperature of the contents of the respective bubbler. They will be stable at the indicated bubbler temperature, but will readily decompose and react at a temperature of the chemical vapor deposition chamber of from 200 to 1,000 degrees Celsius, preferably from 200 to 800 degrees Celsius, and more preferably from 350 to 400 degrees Celsius. Moreover, the respective organometallic compounds are inert at the bubbler temperatures with respect to at least one carrier gas such as nitrogen, helium or another inert gas. Typically, indium compounds for a method of the invention have decomposition temperatures of from 50 to 400 degrees Celsius. As used herein, "decomposition temperature" means a temperature at which at least a measurable amount of the compound is decomposed. Generally, indium compounds as well as organotin compounds for utilization in a method of the invention have melting points of less than 100 degrees Celsius, preferably less than 30 degrees Celsius, and more preferably the respective compounds are liquids at room temperature and ambient atmospheric pressure.

In the preferred embodiments of the invention wherein both indium compounds and organotin compounds are utilized to provide films containing both indium and tin ("indium tin oxide films"), the respective compounds are chosen and operating conditions of the respective bubblers, etc. are selected so as to provide a percent by weight ratio of indium to tin respectively in vapor phase of from 99:1 to 1.99, preferably of from about 75:25 to about 85:15, and usually about 80:20.

As discussed above, indium compounds suitable for a method of the invention generally have a melting point of less than 100 degrees Celsius and a vapor pressure of at least 1 torr at a temperature in the range of from minus 20 degrees to 100 degrees Celsius, preferably at or slightly above the melting point of the indium compound. Examples of indium compounds include the indium alkyls such as trimethylindium and triethylindium; indium compounds as set forth in U.S. Pat. No. 4,720,560 and corresponding to the formula $MR_x$ therein in which "M" represents Indium, x is three and each R is independently selected from lower alkyl, phenyl, alkyl-substituted phenyl, cyclopentadienyl, and alkyl-substituted cyclopentadienyl, some specific examples of which include dimethylethylindium and diethylmethylindium. So much of the disclosure of U.S. Pat. No. 4,720,560 as relates to such indium compounds is hereby specifically incorporated herein by reference. Particularly preferred indium compounds, are alkyl indium etherates such as trimethylindium etherate made by reacting indium chloride and methyllithium in diethylether as more specifically set forth infra. It is also contemplated that utilization of alkyl indium etherates prepared by forming the respective adduct of an alkyl indium, for example trimethylindium, with an oxygen-containing solvent for example the cyclic ether tetrahydrofuran, is within the scope of the present invention. Additional examples of indium compounds include indium alkoxides corresponding to the formula $In(OR)_3$ in which R is represented by an alkyl group having from 1 to 4 carbon atoms, specific examples of which include the respective methoxy and propoxy compounds.

As discussed above, organotin compounds suitable for a method of the invention generally have a melting point of less than 100 degrees Celsius and a vapor pressure of at least 1 torr at a temperature in the range of from minus 20 degrees to 100 degrees Celsius. The organotin compounds for the present invention contain at least one oxygen atom directly bonded to tin. Examples of organotin compounds include alkoxides containing from 1 to 4 carbon atoms in the alkoxide group such as tin(IV)methoxide, tin(IV)ethoxide, tin(IV)propoxide and tin(IV)butoxide; as well as other organotin compounds such as tin(II)ethylhexanoate.

In operating the metal organic chemical vapor deposition apparatus, the carrier gas is introduced into the bubbler under the surface of the organometallic compound. Rising bubbles of the carrier gas provide a large, constant contact surface and thus the concentration of organometallic compound being transported by the carrier gas can be uniformly controlled. The carrier gas and vapor collected in the headspace of the bubbler are continuously directed to the deposition chamber. The flow rates for the carrier gas in the respective bubblers generally will range from a few cubic centimeters per minute (such as from 5 cubic centimeters/minute) to a few liters per minute (such as to 5 liters/minute). The respective bubblers normally are operated at ambient atmospheric pressure. However reduced pressure can be utilized if desired, for example, to increase the efficiency of transporting organometallic compound in the carrier gas out of the bubbler via enhanced volatility of the organometallic compound at reduced pressure.

Likewise, in operating the metal organic chemical vapor deposition apparatus, the chemical vapor deposition chamber normally is maintained at ambient atmospheric pressure. If desired, reduced pressure can be utilized therein to enhance the quality of the morphological properties of the resultant oxide film so as to provide, for example, more uniform film thickness on the substrate.

Also in a process of the invention a source of oxygen is provided to the chemical vapor deposition chamber thereby making oxygen available to the reactants in the chamber for formation of the oxide coating on the substrate. The source or oxygen normally is introduced into the chemical vapor deposition chamber through a line separate from those connecting the bubbler(s) to the chamber. Oxygen may be introduced as elementary oxygen, as water vapor, or as a mixture of oxygen saturated with water vapor. While not intending to be bound by any chemical theory, it is believed that the oxide coating is formed directly on the surface of the substrate which is held in the deposition chamber at elevated temperature, from 200 to 800 degrees Celsius.

The process of the invention typically is used in coating glass substrates However any suitable substrate may be employed such as, for example, substrates utilized in semiconductors such as gallium arsenide and silicon wafers. A preferred embodiment of the invention consists of a substrate having on a surface thereof, preferably a glass surface, an adherent, visibly transparent, electrically conductive, oxide coating containing indium and tin, i.e., an indium tin oxide film. The coating (or film) is deposited on the substrate by a method of the invention as described above, preferably utilizing an indium alkyl etherate. Preferably the coating contains from about 75 percent to about 85 percent by weight indium and from about 25 percent to about 15 percent by weight tin, typically from about 80 percent by weight indium and about 20 percent by weight tin. Films produced by the method of the invention have good electrical conductivity and are transparent to visible light. Preferably, films produced by the method of the invention have an electrical conductivity, measured as surface resistivity, of less than 50,000 ohms per square and a transparency, measured as percent light transmission in the visible range, of greater than 70 percent or higher.

The following example is provided to illustrate more specifically the preparation of an indium alkyl etherate suitable for the method of the invention.

EXAMPLE 1

In a glove bag, 1500 grams (6.78 moles) of $InCl_3$ are weighed into a 12 liter, 3 neck flask which has been previously evacuated and backfilled with nitrogen. The 12 liter flask is placed in a heating mantle and is supported on a large jackstand. The 12 liter reaction flask is then equipped with a 1 liter addition funnel, mechanical stirrer, and an 18 inch (46 cm) Vigreux column connected to a 5 liter, 3 neck receiver by a Claisen head. ("Vigreux" and "Claisen" are not believed to be trademarks.) The 5 liter receiver is connected to a nitrogen bubbler A source of methyllithium (1.5 molar, low halide, in diethyl ether) is connected via stainless steel tubing to the 1 liter addition funnel. The drip tip of the addition funnel extends below the level of the greased joint since Methyllithium ("MeLi") is reactive towards halocarbon grease.

About 2 liters of diethyl ether are pressure siphoned into the 12 liter reaction flask to make a stirrable slurry with the $InCl_3$.

The 5 liter receiver and dry ice condenser are cooled with a mixture of isopropanol (IPA) and dry ice, and the addition of MeLi is begun. The reaction is run at reflux and ether is distilled up the Vigreux column and collected in the 5 liter receiver. It is not necessary to heat the reaction flask, as the heat of reaction is sufficient to maintain reflux.

The addition of MeLi is continued until 4.4 moles MeLi per mole of $InCl_3$ has been added. (The concentration of the MeLi is determined by titrating several 10 milliliter aliquots with standard acid solution, i.e., 0.1N hydrochloric acid.) When the 12 liter reaction flask becomes full, it is necessary to stop the addition of MeLi and distill off ether by heating the reaction mixture to reflux using a heating mantle. The receiver is emptied several times during the process by siphoning out the distilled ether. The total volume of MeLi solution added is about 20 liters (4.4 moles of MeLi per mole of $InCl_3$).

After the MeLi is added to the 12 liter reaction flask, the addition funnel is removed and replaced with a nitrogen inlet with a shutoff valve. The reaction flask is heated with the heating mantle to continue distilling off ether until the volume of the reaction mixture is below 5 liters. At this point, stirring is discontinued and the reaction mixture is allowed to settle overnight.

The Vigreux column, Claisen head, and receiver are removed from the reaction flask. The contents flask consists of a white precipitate (believed to be LiCl and a polymer of methyllithium) settled beneath an orange solution containing the trimethylindium etherate.

What is claimed is:

1. The process of depositing an oxide coating containing indium on a substrate comprising:
   (A) transporting, in an inert carrier gas, vapors of an indium alkyl etherate having a melting point of less than 100 degrees Celsius and a vapor pressure of at least 1 torr at a temperature in the range of from minus 20 degrees to 100 degrees Celsius and which is a liquid at room temperature and ambient atmospheric pressure;
   (B) heating said substrate to a temperature of from about 200 to 800 degrees Celsius; and
   (C) contacting said heated substrate in an oxidizing atmosphere with vapors from said indium alkyl etherate to form said oxide coating containing indium on said substrate.

2. The process of claim 1 wherein said indium alkyl etherate has a melting point of less than 30 degrees Celsius.

3. The process of claim 1 wherein said oxidizing atmosphere comprises oxygen gas.

4. The process of claim 1 wherein said oxidizing atmosphere comprises a mixture of oxygen gas and water vapor.

5. The process of claim 1 wherein said inert carrier gas comprises nitrogen.

6. The process of claim 1 wherein said indium alkyl etherate is trimethylindium etherate.

7. The process of depositing an oxide coating containing indium and tin on a substrate comprising:
   (A) transporting, in an inert carrier gas, vapors of an indium alkyl etherate having a melting point of less that 100 degrees Celsius and a vapor pressure of at least 1 torr at a temperature in the range of from minus 200 degrees to 100 degrees Celsius and which is a liquid at room temperature and ambient atmospheric pressure;
   (B) transporting in an inert carrier gas vapors of an organotin compound having at least one oxygen atom in a molecule thereof, having a melting point of less that 100 degrees Celsius and a vapor pressure of at least 1 torr at a temperature in the range of from minus 20 degrees to 100 degrees Celsius, and having a thermal stability such that the mole percent decomposition of said organotin compound at a given temperature is in a range of from 10 percent to 100 percent of the mole percent decomposition of said indium alkyl etherate at said given temperature;
   (C) heating said substrate to a temperature of from about 200 to 800 degrees Celsius; and
   (D) contacting said heated substrate in an oxidizing atmosphere with vapors from said indium alkyl etherate and said organotin compound to form said oxide coating containing indium and tin on said substrate.

8. The process of claim 7 wherein said indium alkyl etherate has a melting point of less than 30 degrees Celsius.

9. The process of claim 7 wherein said oxidizing atmosphere comprises oxygen gas.

10. The process of claim 7 wherein said oxidizing atmosphere comprises a mixture of oxygen gas and water vapor.

11. The process of claim 7 wherein the amounts of said vapors of said indium compound and said vapors of said organotin compound are selected so as to provide a percent by weight ratio of indium to tin respectively in vapor phase of from about 75:25 to about 85:15.

12. The process of claim 7 wherein the amounts of said vapors of said indium alkyl etherate and said vapors of said organotin compound are selected so as to provide a percent by weight ratio of indium to tin respectively in vapor phase of from about 80:20.

13. The process of claim 7 wherein said inert carrier gas, for said vapors of said indium compound and for said vapors of said organotin compound, comprises nitrogen.

14. The process of claim 7 wherein said indium alkyl etherate is trimethylindium etherate.

* * * * *

UNITED STATES PATENT AND TRADEMARK OFFICE
CERTIFICATE OF CORRECTION

PATENT NO. : 5,147,668

DATED : September 15, 1992

INVENTOR(S) : Andreas A. Melas

It is certified that error appears in the above-identified patent and that said Letters Patent is hereby corrected as shown below:

At column 1, line 42, "deposition The" should be -- deposition. The --.

At column 1, line 57, "chamber The" should be -- chamber. The --.

At column 2, line 6, "temperature Moreover," should be -- temperature. Moreover, --.

At column 3, line 15, "properties The" should be -- properties. The --.

At column 4, lines 3 & 4, "compound Each" should be -- compound. Each --.

At column 4, line 55, "include the" should be -- include: the --.

At column 5, line 20, "include alkoxides" should be --iinclude: alkoxides --.

At column 6, line 37, "bubbler A" should be -- bubbler. A --.

At column 8, lines 31 & 41, "compound" should be -- alkyl etherate --.

Signed and Sealed this

Nineteenth Day of April, 1994

Attest:

BRUCE LEHMAN

Attesting Officer

Commissioner of Patents and Trademarks